United States Patent [19]

Seitoh et al.

[11] Patent Number: 5,093,616

[45] Date of Patent: Mar. 3, 1992

[54] VOLTAGE MEASUREMENT METHOD USING ELECTRON BEAM

[75] Inventors: Shigemitsu Seitoh, Kokubunji; Hideo Todokoro, Tokyo; Satoru Fukuhara, Katsuta; Hiroyuki Shinada, Chofu, all of Japan

[73] Assignee: Hitachi, Ltd., Tokyo, Japan

[21] Appl. No.: 580,532

[22] Filed: Sep. 11, 1990

[30] Foreign Application Priority Data

Sep. 14, 1989 [JP] Japan .................................. 1-237041

[51] Int. Cl.$^5$ .............................................. G01R 00/00
[52] U.S. Cl. .................................. 324/158 R; 324/73.1; 324/158 D
[58] Field of Search ............... 324/73.1, 158 R, 158 D, 324/71.3; 250/310, 311, 305, 397

[56] References Cited

U.S. PATENT DOCUMENTS

| | | | |
|---|---|---|---|
| 4,355,232 | 10/1982 | Todokoro et al. | 324/158 R |
| 4,514,682 | 4/1985 | Feuerbaum | 324/158 R |
| 4,554,455 | 11/1985 | Todokoro et al. | 324/158 R |
| 4,980,639 | 12/1990 | Yoshizawa et al. | 324/158 R |

FOREIGN PATENT DOCUMENTS 61-239554 10/1986 Japan .

OTHER PUBLICATIONS

"Hitachi Review", vol. 65, No. 7, 1983, pp. 33-34.

Primary Examiner—Kenneth A. Wieder
Assistant Examiner—Vinh P. Nguyen
Attorney, Agent, or Firm—Fay, Sharpe, Beall, Fagan, Minnich & McKee

[57] ABSTRACT

An electron beam is irradiated on a sample to generate secondary electrons from the sample, the secondary electrons are detected by a secondary electron detector through a retarding grid to provide a secondary electron detector output signal, the relation is acquired in advance between a known sample voltage and a value (normalized secondary electron signal for the known sample voltage) resulting from dividing a differential value of the secondary electron detector output signal at a retarding grid voltage by the secondary electron detector output signal, and this relation is retrieved with a normalized secondary electron signal obtained with an unknown sample voltage to determine an absolute value of the unknown sample voltage.

7 Claims, 10 Drawing Sheets

SECONDARY ELECTRON SIGNAL CHARACTERISTIC

KNOWN SAMPLE VOLTAGE VERSUS NORMALIZED
SECONDARY ELECTRON SIGNAL CHARACTERISTIC

VOLTAGE MEASUREMENT METHOD USING ELECTRON BEAM

BACKGROUND OF THE INVENTION

The present invention relates to a voltage measurement method and apparatus using an electron beam.

With the recent trend of minimization of wiring diameter attributable to high-density and high-integration formation of LSI's, fault diagnosis and defect analysis of LSI's wherein waveform observation and voltage measurement are carried out by using a thin mechanical probe and an oscilloscope have been very difficult to perform. Even in an analysis method which compares and collates the input and output signals of the LSI, it takes a long time to locate and settle a malfunctioning point and frequently, the malfunctioning point is unlocated and unsettled. As an approach to this problem, an electron beam LSI tester has been proposed which uses an electron beam as a probe for voltage measurement (reference literature: "Electron Beam LSI Tester", Hitachi Review 65, 7 (1983, 7) pp. 33–38).

The principle of voltage measurement using an electron beam and a conventional measuring method will now be described with reference to FIGS. 7 to 11.

Referring to FIG. 7, when an electron beam 1 is irradiated on a sample 2, secondary electrons 3 are discharged from the sample 2. Energy of the secondary electrons 3 is analyzed by means of an energy analyzer constructed of two semispherical grids 4 and 5. For extraction of secondary electrons, a constant voltage E4 of $+10V$ to $+100V$ is applied to the inner grid 4. Under this condition, when a voltage E5 applied to the outer retarding grid 5 is changed within a range of, for example, $-30V$ to $+30V$, the relation between application voltage E5 on the retarding grid 5 and output voltage Es from a secondary electron detector 6 can be displayed in the form of an Es-E5 curve 8 which is similar to the "S" curve 8 shown on a display 7. This curve corresponds to a curve obtained by sequentially integrating an energy distribution of secondary electrons from a higher level of energy. As the sample voltage changes, the position of the S curve shifts.

FIG. 8 illustrates examples of S curves for different sample voltages, indicating that the S curve shifts from 8a to 8b as the sample voltage changes. Since the amount of shift reflects the change in sample voltage, voltage applied to the sample can be measured on the basis of the shift amount of the S curve. More specifically, a slice level 11 is set up in association with the S curves as shown in FIG. 8, retarding grid voltages Va and Vb at intersections of the slice level with the S curves are determined, and a difference (Vb − Va) is measured to determine a change in sample voltage.

If in FIG. 8 the curves 8a and 8b merely shift so as to be saturated at the same level, no problem is raised. However, in the event that the electron beam current changes either during an interval between completion of measurement to determine curve 8a for a known sample voltage portion and commencement of measurement to determine curve 8b, or during the measurement of curve 8a, or in the event that a great amount of contamination is deposited on a portion of the sample on which the electron beam is irradiated, the curve 8b changes to a dashed curve 8b' having a saturation level of S curve which is lower than that of the curve 8b. Accordingly, when the curve 8b' is associated with the aforementioned slice level, there results a large measurement error.

To solve this problem, a measurement method as proposed by, for example, JP-A-61-239554 has hitherto been employed wherein a distribution of normalized secondary electron signal as shown in FIG. 9B is used for measurment. The conventional method will now be described.

FIG. 9A shows an S curve. Secondary electron detector output signals IcO, Ic1 and Ic2 are determined from the S curve at a certain retarding grid voltage Vg and retarding grid voltages which are $\pm\Delta Vg$ shifted from Vg, and the following equation $$(Ic1 - Ic2)/(2 \cdot \Delta Vg \cdot Ic0) \tag{1}$$

is calculated. By performing this calculation over the entire range of the retarding grid voltage, the normalized secondary electron signal distribution of FIG. 9B can be obtained. This distribution is advantageous in that the change in secondary electron signal due to the change in electron beam current or the deposition of contamination is cancelled out, and therefore it is preferable that the sample voltage be determined on the basis of a shifting of the distribution. More specifically, as in the case of the S curve described with reference to FIG. 8, a slice level is set up and a difference between retarding grid voltages is measured to determine a change in sample voltage.

When an AC voltage such as a rectangular wave is applied to the sample, a waveform and a voltage at a desired time point within the waveform can be measured according to a method as will be described below with reference to FIG. 10.

In FIG. 10, a rectangular wave is supplied to a sample 2. A constant voltage E5 is supplied to a retarding grid 5. Secondary electrons 3 generated from the sample 2 under irradiation of an electron beam pass through the retarding grid 5 and are detected by a secondary electron detector 6. The secondary electron signal produced from the detector 6 changes as the sample voltage changes. The changing secondary electron signal is converted into a digital signal at the rate of, for example, 5 nanoseconds ($10^{-9}$) by means of a high-speed A/D converter 10 succeeding the secondary electron detector 6 and fetched into a signal processor 11 comprising a memory and the like components. The output signal of the detector is displayed with respect to time lapse on a display 7 to provide an AC waveform which can be observed. In order to determine an absolute value of such an AC waveform, the voltage E5 to be applied to the retarding grid 5 is changed as in the case of DC voltage and the AC waveform is fetched each time the voltage E5 is changed so that S curves may be acquired at all time points, and thereafter normalized secondary electron signal distributions are prepared and a shift amount of distribution is measured to determine a sample voltage.

When the AC waveform supplied to the sample is of high speed and high frequency, AC waveform measurement based on a stroboscopic method is carried out.

FIG. 11 illustrates a basic arrangement for AC waveform measurement based on the stroboscopic method. A pulse generator 21 is a power source used to pulse an electron beam 1 and it is triggered and driven by a delay circuit 22. The delay circuit 22 is adapted to sequentially delay timings for irradiation of the pulsed electron beam 1 on a sample 2 and controlled by a computer 15. With this construction, when the pulsed electron beam is irradiated on the sample with the delay circuit 22 fixed at a certain timing (phase), secondary electrons discharged at that timing are detected. Subsequently, the timing (phase) of the delay circuit is shifted slightly and secondary electrons are detected in a similar manner. By repeating the above operation by, for example, 1024 times over one period of the waveform, even the high-speed and high-frequency waveform can be measured with ease. In this case, voltage E5 to be applied to the retarding grid is changed at the individual timings to prepare normalized secondary electron signal distributions and the waveform is displayed in the absolute value form.

The method of obtaining the absolute value by preparing the normalized secondary electron signal distribution faces no problem when the object to be measured is DC voltage.

However, when the method is applied to the AC periodic voltage to be measured by using the aforementioned high-speed A/D converter and stroboscopic method, S curves must be measured at a plurality of points constituting a waveform and disadvantageously the measurement time is increased. Especially, the method can not be used practically to measure such a sample as a logic LSI having a very long operation period.

Therefore, a voltage measurement apparatus based on the above measuring method can not determine and display, with ease, an absolute value of voltage at a desired time point within an AC waveform to be measured and absolute values over the entire AC period.

SUMMARY OF THE INVENTION

The present invention contemplates elimination of the above problems and has for its object to provide a voltage measurement method and apparatus capable of determining a voltage absolute value at a desired time point or voltage absolute values at all time points within a measured AC period, and of displaying a voltage waveform.

According to a first feature of the invention, in a voltage measurement apparatus using an electron beam, a secondary electron signal detected under irradiation of the electron beam on a measuring point or portion applied with an unknown sample voltage is normalized at least once, and an absolute value of the voltage applied to the electron beam irradiated portion is determined by retrieving, with a normalized secondary electron signal, the relation which is acquired in advance between a known sample voltage and a normalized value. Known sample voltages may be derived from a standard sample to which voltage is applicable or from a voltage source in LSI's. The normalization referred to herein is effected by dividing a differential value of a secondary electron detector output signal at a retarding grid voltage by the secondary electron detector output signal at the retarding grid voltage. Advantageously, the normalized value is immune from, for example, changes in the electron beam current.

According to a second feature of the invention, an absolute value of voltage at a desired time point within an AC waveform obtained by measuring an AC voltage supplied to a predetermined position of a sample is determined by consulting a known sample voltage versus a normalized secondary electron signal characteristic described in connection with the first feature, the relation which is acquired in advance between a known sample voltage and secondary electron detector output signal is retrieved with secondary electron detector output signals detected at the other time points within the AC waveform to obtain relative voltages to the voltage at the desired time point, and absolute values of voltages at the other time points within the AC waveform are displayed in accordance with correlation of the relative voltages to the absolute value at the desired time point.

According to a third feature of the invention, the desired time point described in connection with the second feature is a measurement commencement point of the AC periodic voltage measurement.

According to a fourth feature of the invention, the desired time point described in connection with the second feature is a time point at which the lowest voltage level occurs within the AC period.

According to a fifth feature of the invention, the lowest voltage level time point within the AC period described in connection with the fourth feature is selected from a measured waveform after the relation between AC periodic voltage and secondary electron detector output signal is measured for an unknown voltage sample.

According to a sixth feature of the invention, the absolute value described in connection with the first feature is determined on the basis of secondary electron signals corresponding to peak values of histograms representative of secondary electron detector output signals, the relation which is acquired in advance between a known voltage and a secondary electron detector output signal is retrieved with secondary electron detector output signals detected at all time points within the measured AC period to obtain relative voltages to absolute values at the secondary electron signals corresponding to the peak values, and absolute values of the AC periodic voltage are determined in accordance with a correlation of the relative voltages to the absolute values at the secondary electron signals corresponding to the peak values.

According to a seventh feature of the invention, when the peaks of the histograms are localized at a plurality of locations, peaks obtained with the lowest voltage level are used as the peak values described in connection with the sixth feature.

The first feature permits voltage measurement immune from changes in electron beam current and the like factor, and ensures display in the absolute value form of voltage at a measuring point by using a known sample voltage versus normalized secondary electron signal characteristic, thus improving the performance of the voltage measurement apparatus using the electron beam.

The second feature permits absolute values of voltages at individual time points within an AC waveform obtained through AC voltage measurement to be determined within a short period of time, thus improving efficiency of measurement by the voltage measurement apparatus using the electron beam.

The third feature eliminates the necessity of designation of a desired time point required for determination of an absolute value within the AC period, thus improving ease of handling of the voltage measurement apparatus using the electron beam.

The fourth and fifth features permits voltage measurement at a time point (phase) at which the secondary electron signal level is higher, thus improving accuracy of determination of an absolute value at that time point and consequently reliability of determination of absolute values at other time points (phases).

The sixth and seventh features permit absolute value measurement by using secondary electron detector output signals corresponding to peaks of frequencies at which secondary electron signals are detected through measurement of the AC periodic voltage, thus improving accuracy of the determination of an absolute value and consequently reliability of determination of absolute values at other time points (phases).

DESCRIPTION OF THE PREFERRED EMBODIMENTS

The invention will now be described by way of example with reference to the accompanying drawings.

Figure 1:
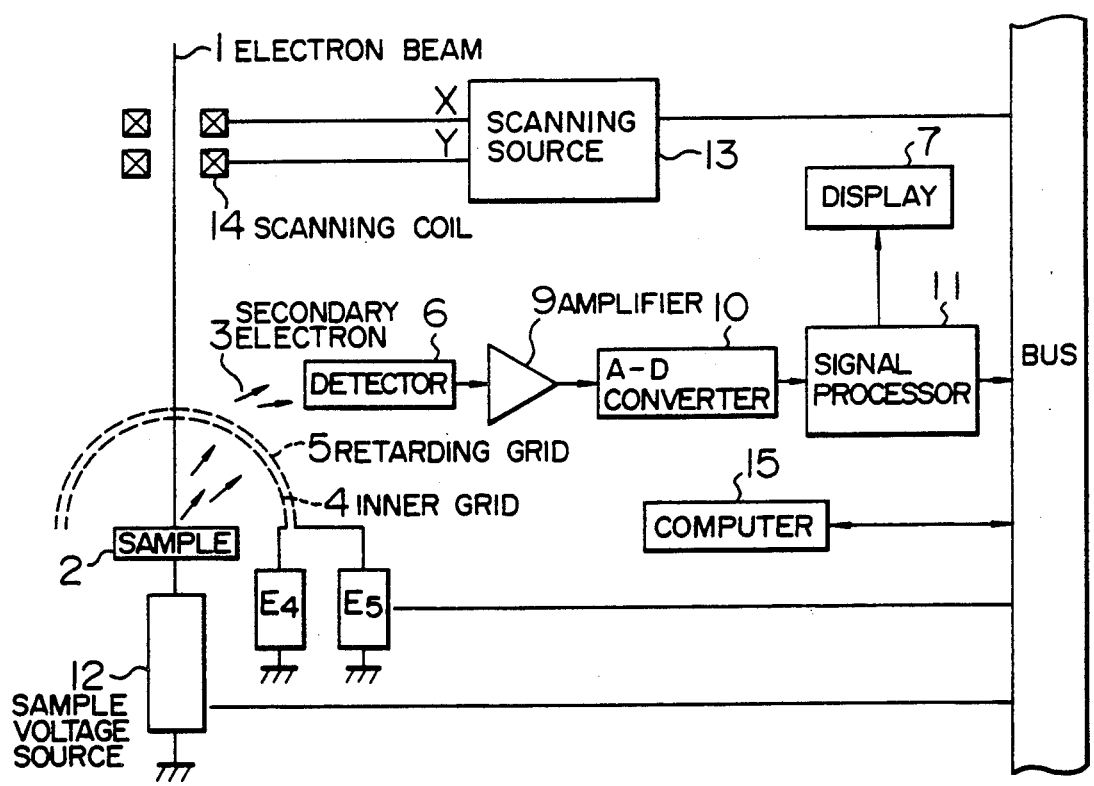
FIG. 1 is a block diagram showing the basic construction of a voltage measurement apparatus according to an embodiment of the invention.

FIG. 1 shows a basic construction of a voltage measurement apparatus according to the invention.

Referring to FIG. 1, an electron beam 1 is irradiated on a sample 2 under the direction of the output signal of a scanning source 13. The scanning source 13 is a power source for two-dimensional scanning of the electron beam 1 on the sample 2 and can be assigned with the irradiation position of the electron beam 1 during voltage measurement by means of a computer 15 or by manual input operation. The sample 2 is supplied with DC or AC voltage from a sample voltage source 12 which is controlled by the computer 15 or by manual input operation. A retarding grid 5 is supplied with DC voltage from a voltage source E5 controlled by the computer 15.

Secondary electrons 3 generated from the sample 2 under the irradiation of the electron beam 1 are detected by a detector 6 to provide a signal, which is amplified by an amplifier 9 and converted by an A/D converter 10 into a digital signal being inputted into a signal processor 11. In the signal processor 11, the A/D converted secondary electron signal is subjected to signal processings such as averaging and smoothing to provide data such as voltage waveforms. The output signal of the signal processor 11 is sent to a display 7 or the computer 15.

A voltage measurement method and an absolute value determination method will now be described with reference to FIGS. 2A and 2B and FIGS. 3A and 3B.

Figure 3A:
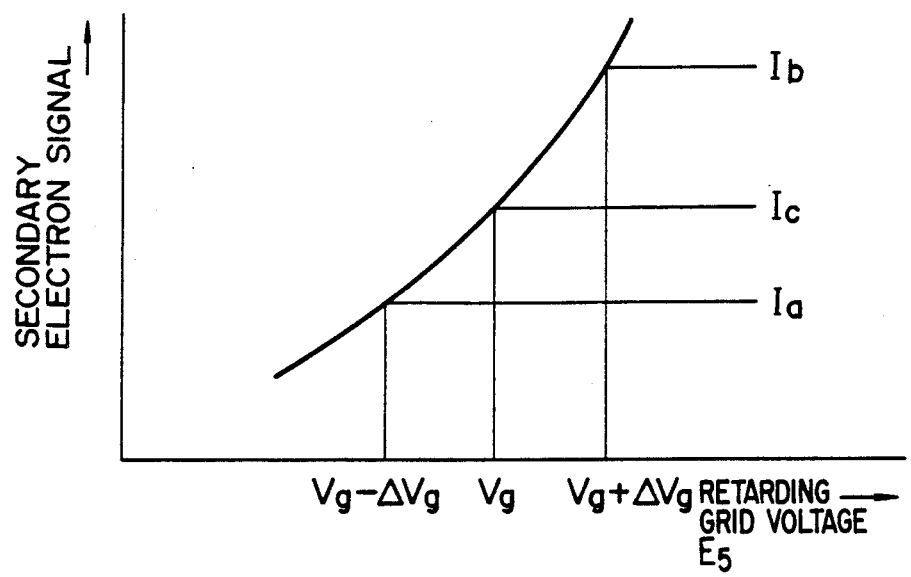
FIGS. 3A and 3B are graphs useful to explain a normalized secondary electron signal characteristic.
Figure 3B:
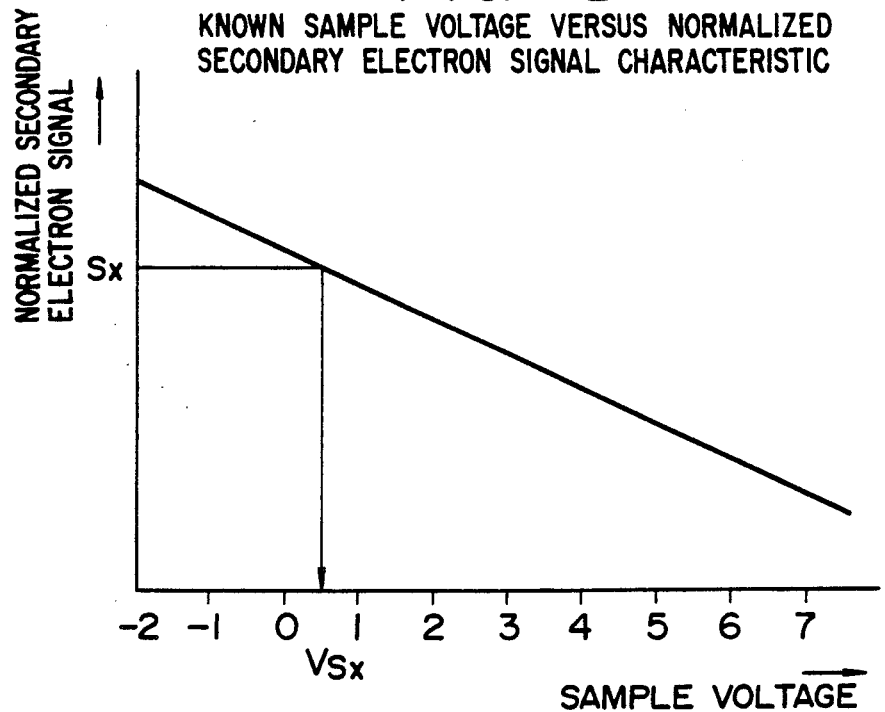

The present invention requires that a known sample voltage versus normalized secondary electron signal characteristic as shown in FIG. 3B be acquired or prepared in advance of execution of measurement of unknown voltage. First of all, this procedure will be described.

Figure 2A:
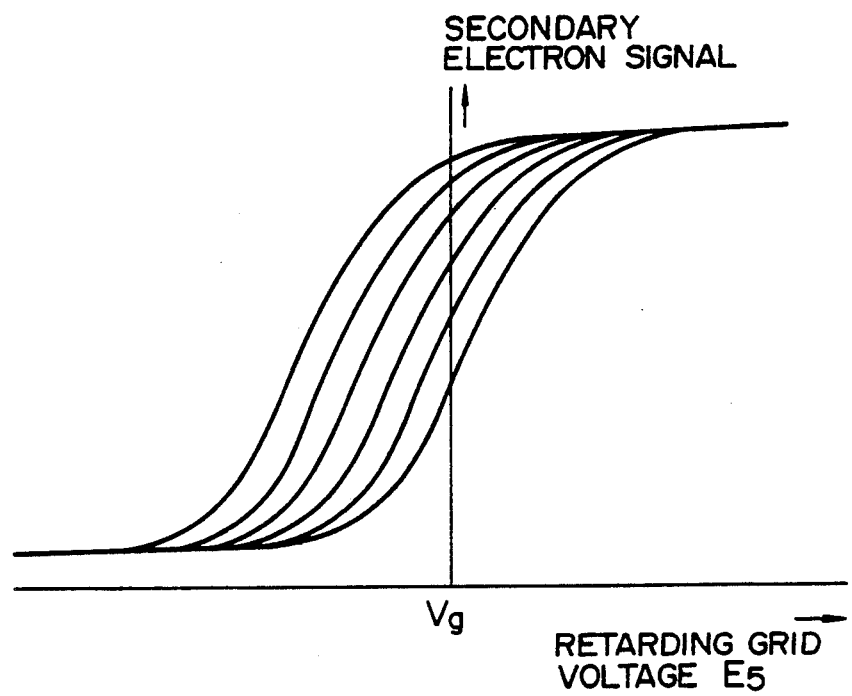
FIG. 2A is a graph showing S curves.

FIG. 2A shows S curves obtained when the sample voltage is changed, for example, from 0V to +5V at an interval of 1V, and FIG. 3A shows exaggeratedly part of one of the S curves.

Referring to FIG. 3A, voltage E5 to be applied to the retarding grid is changed to take values Vg − ΔVg, Vg and Vg + ΔVg and corresponding secondary electron signals Ia, Ic and Ib are fetched. By using these values, the following equation $$(Ib - Ia)/(2 \cdot \Delta Vg \cdot Ic) \qquad (2)$$

is calculated to obtain a normalized secondary electron signal at the retarding grid voltage Vg. Through the above normalization, changes in the secondary electron signal due to changes in the electron beam and the like factor can be cancelled out. This normalization processing is carried out at the retarding grid voltage Vg by changing the sample voltage from −2V to +7V, for example, and resulting normalized secondary electron signals are plotted with respect to the sample voltage, thereby providing the known sample voltage versus normalized secondary electron signal characteristic shown in FIG. 3B. This characteristic is stored in, for example, the computer 15 of FIG. 1 and used for subsequent calculation of absolute values.

When conducting voltage measurement for an actual LSI sample, for example, the electron beam is first irradiated on a point or portion of unknown sample voltage, the retarding grid voltage is changed as previously described, and secondary electron signals occurring at that time are fetched. Thereafter, the normalization pursuant to the aforementioned equation (2) is effected for at least one retarding grid voltage to obtain a normalized secondary electron signal at the unknown sample voltage point. Assuming that the thus obtained value is Sx in FIG. 3B, a sample voltage which gives the signal Sx is sought by consulting the previously acquired known sample voltage versus normalized secondary electron signal characteristic to determine an absolute value Vsx of voltage at that point.

Figure 2B:
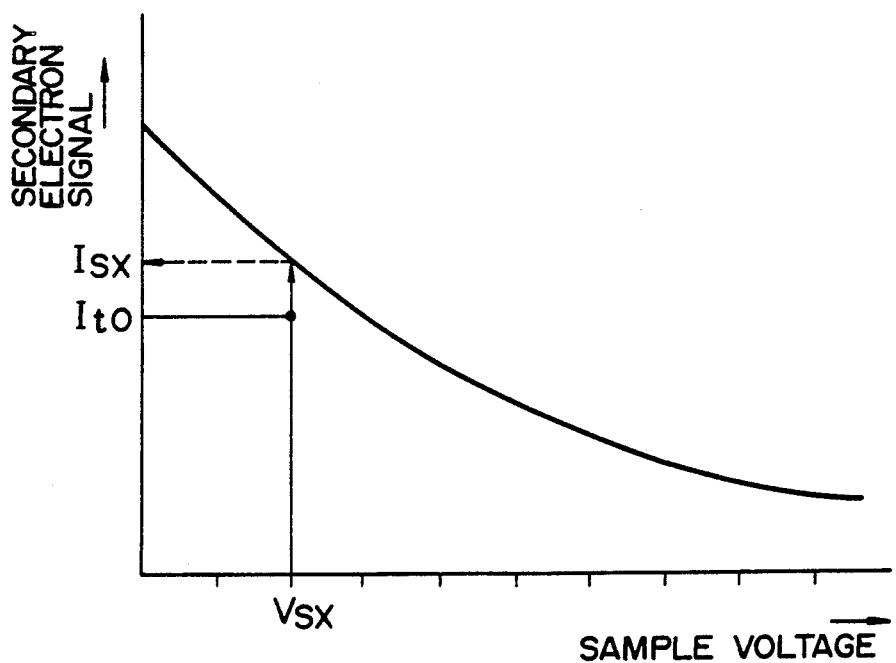
FIG. 2B is a graph showing a secondary electron signal characteristic.
Figure 4A:
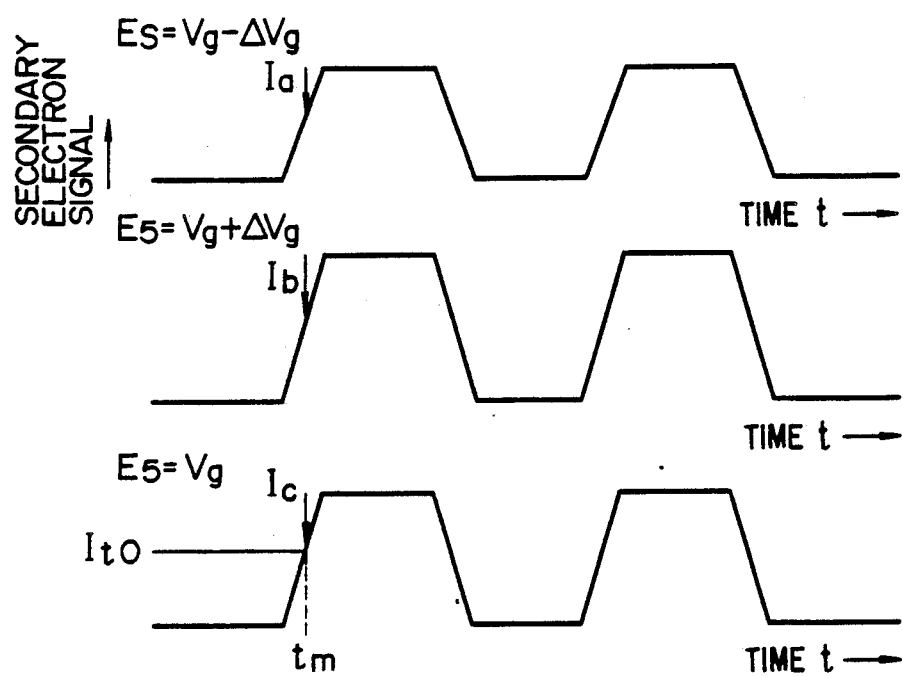
FIGS. 4A, 4B and 4C are graphs useful to explain display of a waveform in absolute value form according to the invention.

In the case where AC voltage is supplied to the sample, AC waveforms are first measured at Vg − ΔVg, Vg and Vg + ΔVg of retarding grid voltage E5 as shown in FIG. 4A in order to acquire secondary electron signals Ia, Ib and Ic at time point tm. Subsequently, the normalization pursuant to the aforementioned equation (2) is effected so that an absolute value Vsx of voltage at time point tm may be determined by consulting the known sample voltage versus normalized secondary electron signal characteristic. Thereafter, voltages at other time points than tm are determined using a secondary electron signal characteristic as shown in FIG. 2B.

A voltage determination method based on the secondary electron signal characteristic will now be described.

In the previous embodiment, a known voltage is applied to the sample to determine the normalized secondary electron signal. Secondary electron signals detected in this procedure under the condition of the retarding grid voltage E5 being, for example, Vg are plotted with respect to the sample voltage to provide a characteristic as shown in FIG. 2B. Secondary electron signals acquired at time points from the AC waveform obtained through measurement of the AC periodic voltage are corrected by consulting that secondary electron signal characteristic to determine relative voltages at the time points to the AC waveform used for obtaining the initial absolute value, and correlation of the relative voltages to the initially obtained absolute value is finally examined to determine absolute values at the time points.

Figure 4B:
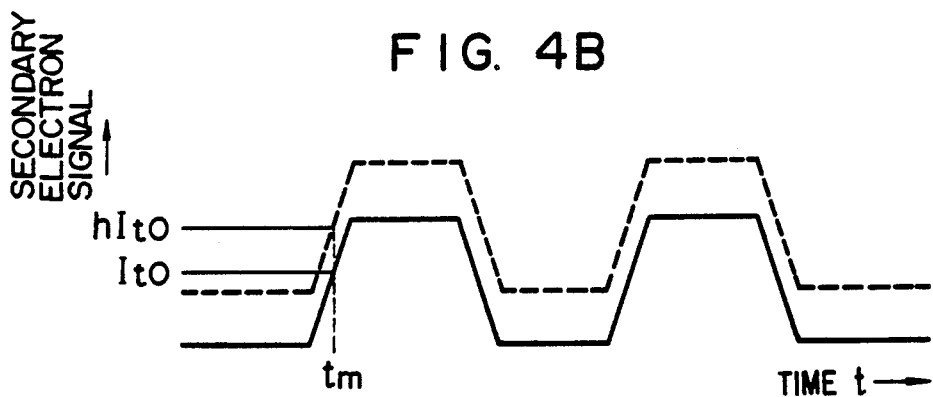
Figure 4C:
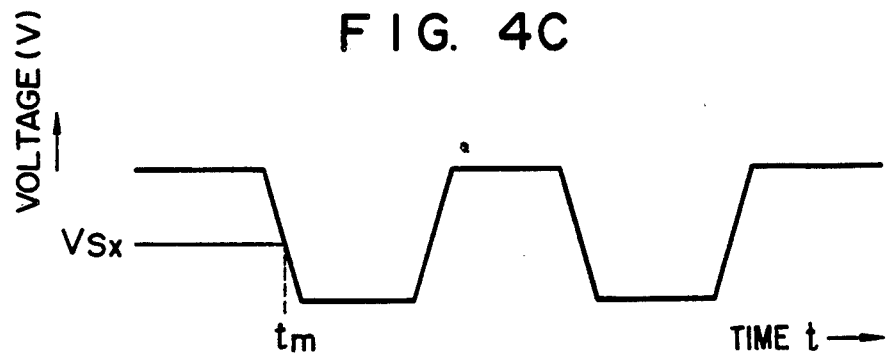

The above procedure will be described more specifically by making reference to the AC waveform. Of the three waveforms shown in FIG. 4A, one waveform for the retarding grid voltage E5 being Vg is taken and it is assumed that the secondary electron signal at time point tm on this waveform is It0. Since the absolute voltage at time point tm is determined as Vsx, the secondary electron signal characteristic of FIG. 2B is looked up to determine ratio k between secondary electron signal Isx at the sample voltage Vsx and secondary electron signal It0 obtained at tm with the retarding grid voltage E5 being Vg. Then, the AC waveform data obtained with the retarding grid voltage E5 being Vg is multiplied by k for correction (see FIG. 4B). Finally, secondary electron signals obtained at the individual phases on the corrected waveform are compared with the secondary electron signal characteristic of FIG. 2B, whereby sample voltages at which the comparison indicates coincidence are determined as voltage absolute values at the time points (phases) on the AC waveform (see FIG. 4C).

The above measurement of AC periodic voltage may be applicable to any of waveform measurement using a high-speed A/D converter and high-speed measurement of high frequency waveform based on a stroboscopic method. In the measurement based on the stroboscopic method, the delay circuit may be controlled to fix the irradiation of the electron beam at a desired phase within the period so that the means described so far may be permitted to determine an absolute value at that phase, thereby attaining an advantage that one operation of waveform measurement with the retarding grid voltage being Vg suffices with the result that the measurement time can be reduced and the capacity of the memory for storage of measured waveforms can be saved.

In the previous embodiment of waveform measurement, one time point at which the absolute value is determined has been described as being a desired time point within the period, but the absolute value may be measured at the start point of measurement of the AC periodic voltage to attain advantages that the designation of a desired point by the operator is unnecessary and, in the case of measurement based on the stroboscopic method, the operation in which the delay circuit is controlled to fix the electron beam at a certain phase can be eliminated.

Figure 5:
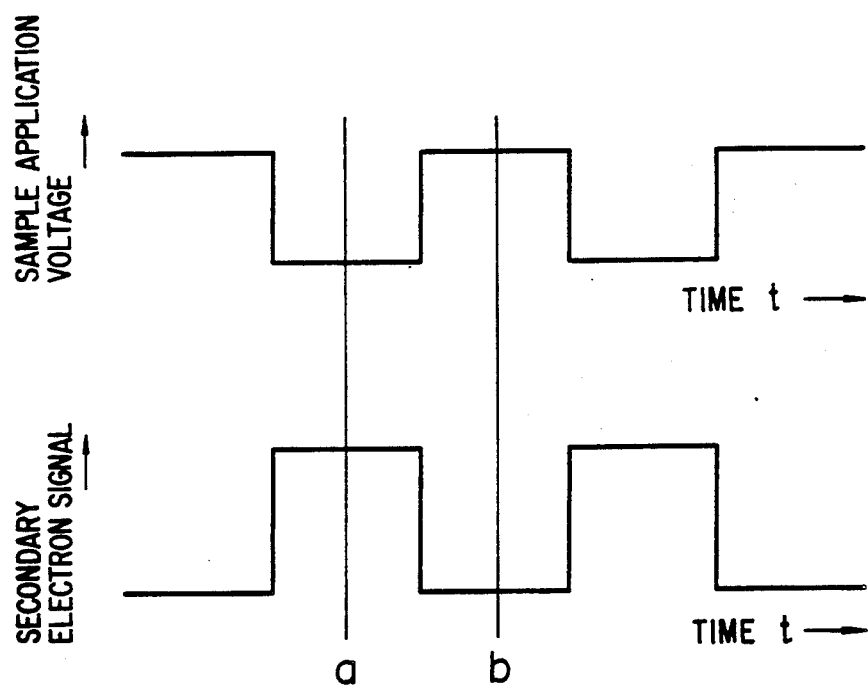
FIG. 5 is a time chart showing the relation between AC periodic voltage and secondary electron signal.

In another embodiment of the invention, the absolute value is determined at a time point at which the lowest voltage level occurs within the AC period. FIG. 5 shows an AC periodic waveform applied to the sample and the state of a secondary electron signal detected under irradiation of an electron beam on the sample. As is clear from this figure, the secondary electron signal is larger at a time point for low level voltage within the AC period (point a) than at a time point for high level voltage (point b) and advantageously, determination of the absolute value at the lower level voltage time point can improve accuracy of the determination at that time point and consequently accuracies of determination of absolute values at other time points.

Still another embodiment of the invention is directed to a method wherein the absolute value may be measured using secondary electron signals corresponding to peak values of histograms representative of the output signal produced from the secondary electron detector upon measurement of the AC periodic voltage.

Figure 6A:
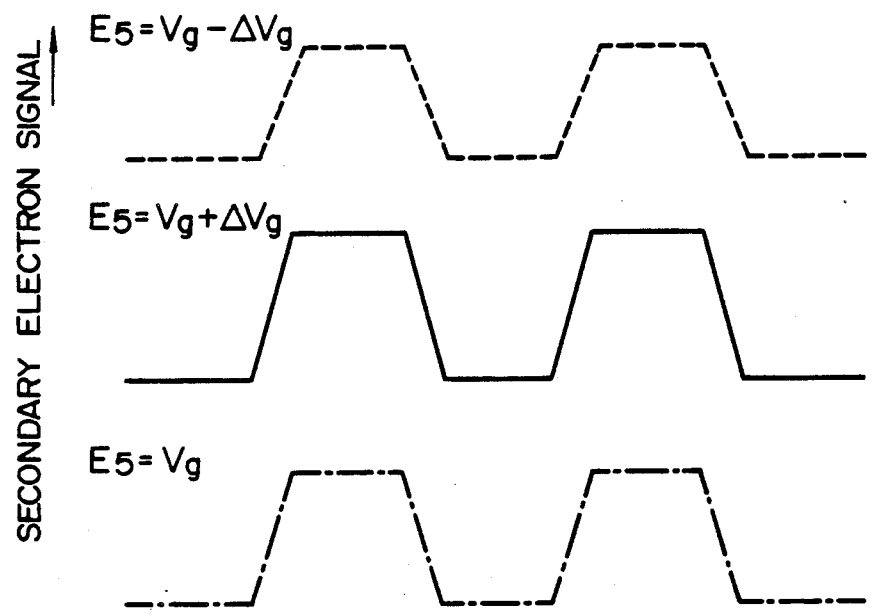
FIGS. 6A and 6B are diagrams useful to explain an absolute value determination method based on histograms according to another embodiment of the invention.
Figure 6B:
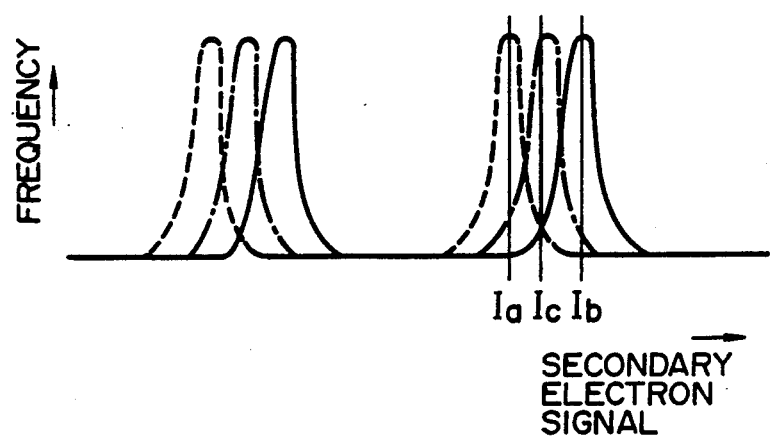
Figure 7:
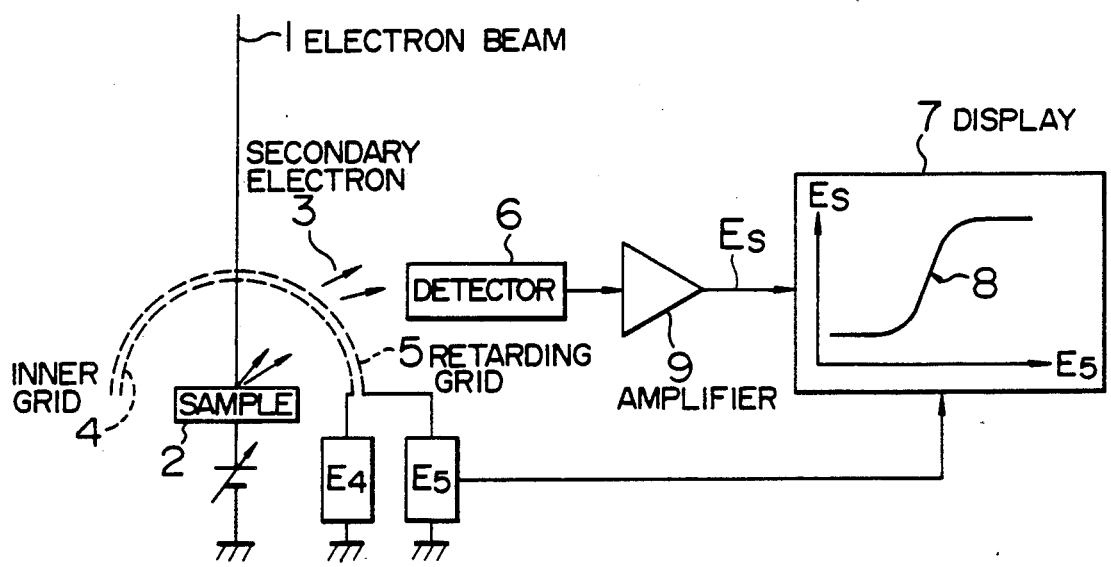
FIG. 7 is a block diagram showing the basic construction of a prior art apparatus for measuring voltage at a micro-portion by using an electron beam.
Figure 8:
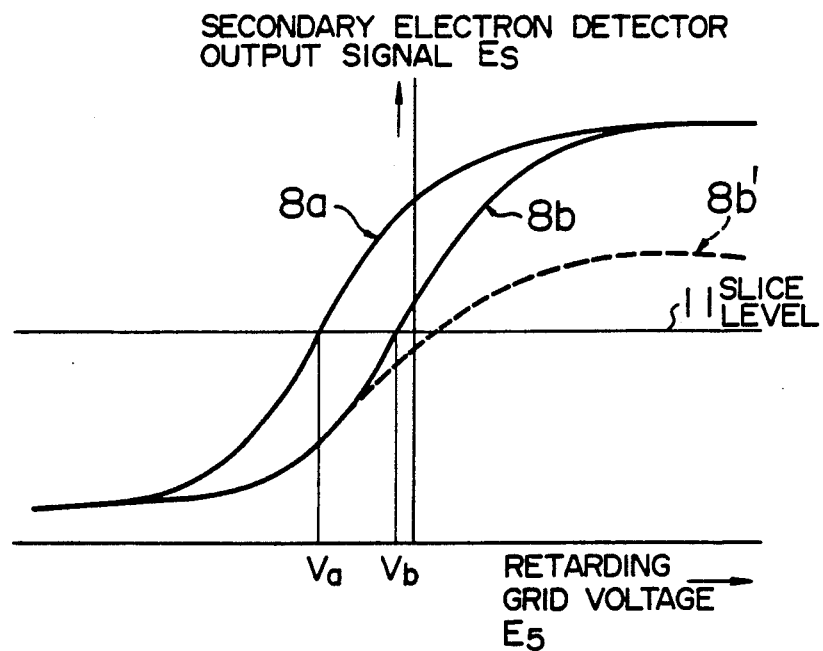
FIG. 8 is a graph useful to explain a prior art voltage measurement method.
Figure 9A:
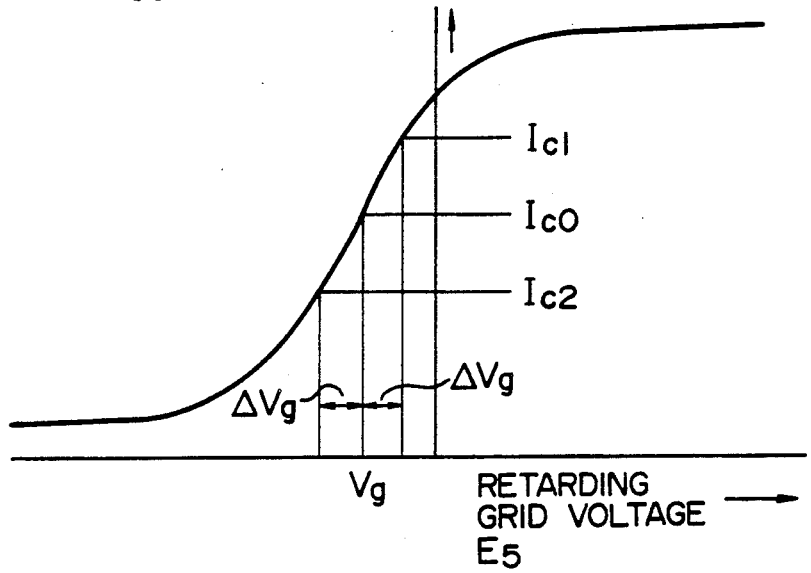
FIGS. 9A and 9B are graphs useful to explain a normalized secondary electron signal distribution.
Figure 9B:
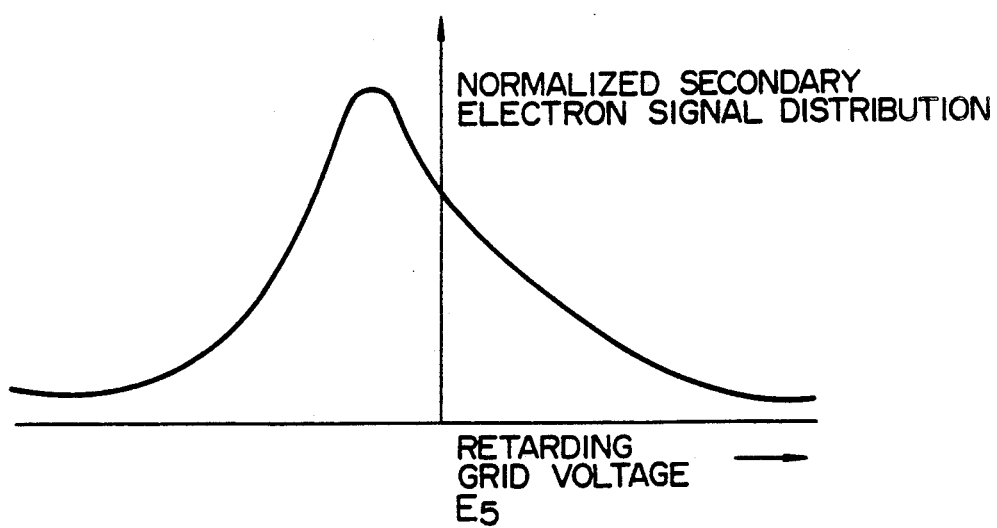
Figure 10:
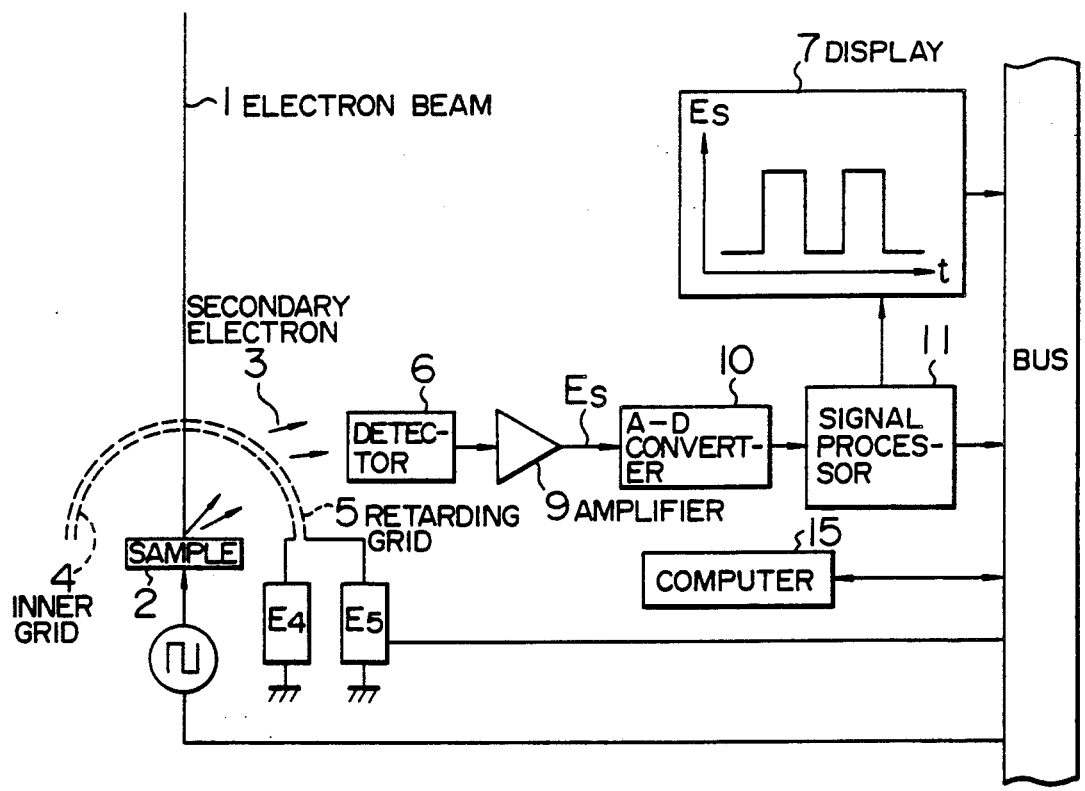
FIG. 10 is a block diagram showing the construction of a prior art apparatus for waveform measurement.
Figure 11:
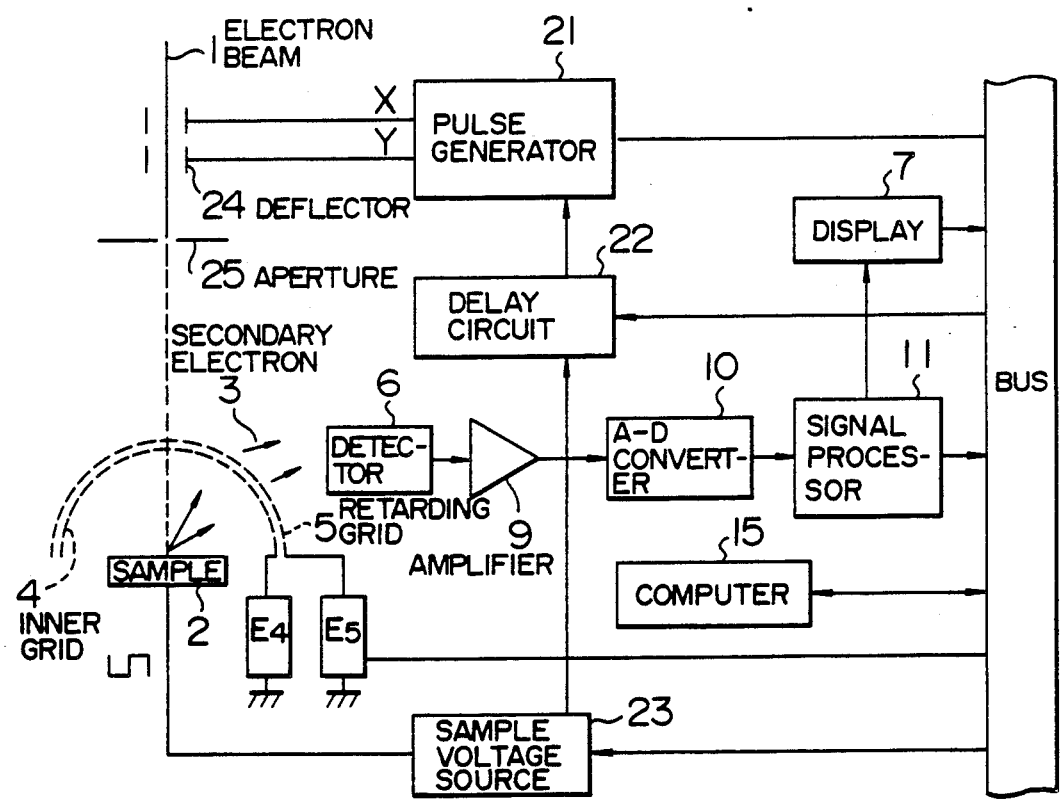
FIG. 11 is a block diagram showing the construction of a prior art apparatus for wavefrom measurement based on the stroboscopic method.

To describe this embodiment, reference should be made to FIGS. 6A and 6B. FIG. 6A shows AC waveforms respectively measured when the retarding grid voltage takes values $Vg - \Delta Vg$, $Vg$ and $Vg + \Delta Vg$ and FIG. 6B shows histograms representative of the waveforms. Secondary electron signals Ia, Ib and Ic corresponding to peak values of the histograms are used to determine the absolute value. The peak value signifies a mean value over the flat portion of the waveform and the use of secondary electron signals corresponding to the peaks is expected to improve reliability of data. Where the peaks of the histograms are localized at two locations as shown in FIG. 6B, determination of the absolute value effected by using secondary electron signals corresponding to histograms obtained with the lowest voltage level, that is, secondary electron signals corresponding to peak values localized to the righthand extreme in FIG. 6B, is expected to improve accuracy.

As has been described by referring to preferred embodiments thereof, the present invention can ensure display of the absolute value of voltage and waveform produced from the voltage measurement apparatus using the electron beam and can improve reliability of the apparatus.

Various modifications of the invention set forth in the foregoing specification will become apparent to those of ordinary skill in the art. All such modifications that basically rely on the teachings through which the invention has advanced the state of the art are properly considered within its spirit and scope.

We claim:

1. A voltage measurement method using an electron beam for measuring voltage from reflected secondary electrons passing through a retarding grid having a retarding grid voltage, comprising the step of:

providing a first sample;
applying a know sample voltage to the first sample;
irradiating the first sample with an electron beam;
detecting, with a detector, secondary electrons discharged from said first sample responsive to said irradiation, said secondary electrons inducing a signal output current from said detectors;
determining in advance a known sample voltage versus normalized secondary electron signal characteristic by plotting the know sample voltage versus a value defined as follows:

$$\text{Hence,} \quad \frac{\Delta \theta_B}{\Delta \lambda} = \frac{1}{nc \, \Lambda_B \cos\theta_B} \quad (15)$$

where $I_b$ equal the current induced in said detector when the retarding grid potential equals $V_g$ plus $\Delta V_g$; $I_a$ equals the induced current when the retarding grid voltage equals $V_g - \Delta V_g$; $I_c$ equals the induced current when the retarding grid voltage equals $V_g$; $V_g$ equals a predetermined reference retarding grid voltage; and $\Delta V_g$ equals a deviation from $V_g$;

storing said known normalized secondary electron signal characteristic;

providing a second sample;

applying an unknown voltage to the second sample;

subsequently irradiating the second sample with the electron beam;

detecting, with a detector, secondary electrons discharged from said second sample responsive to said irradiation, said secondary electrons inducing a signal output current from the detector;

determining an unknown normalized secondary electron signal characteristic for the unknown sample by applying a plurality of different unknown sample voltages to the unknown sample and detecting the induced current for each unknown sample voltage, and by constructing a plot of the relationship between the unknown sample induced currents and the unknown sample voltages, which plot corresponds to the plot of known sample voltage versus normalized secondary electron signal; and comparing said unknow normalized secondary electron signal characteristic with said known normalized secondary electron signal characteristic to determine an absolute value of said unknown sample voltage.

2. A voltage measurement method using an electron beam according to claim 1 wherein the unknown sample voltage is an AC voltage having a waveform, a normalized secondary electron signal is determined at only a desired time point within said waveform, the relation which is determined in advance between the known sample voltage and the secondary electron detector output signal is retrieved with secondary electron detector output signals detected at other time points within said waveform to botain relative voltages to the voltage determined at the desired time point, and absolute values of voltages at other time points within said AC waveform are determined in accordance with correlation of the relative voltages to the absolute value at the desired time point.

3. A voltage measurement method using an electron beam according to claim 2 wherein the desired time point is a measurement commencement point of AC periodic voltage measurement.

4. A voltage measurement method using an electron beam according to claim 2 wherein the desired time point is a time point at which the lowest voltage level occurs within said waveform.

5. A voltage measurement method using an electron beam according to claim 4 wherein the lowest voltage level time point is selected from a measured waveform after the relation between Ac periodic voltage and secondary electron detector output signal is measured.

6. A voltage measurement method using an electron beam according to claim 4 wherein said comparing step further comprises the step of determining the absolute value on the basis of secondary electron signals corresponding to peak values of histograms representative of secondary electron detector output signals for an AC periodic voltage as the unknown sample voltage, the relation which is acquired in advance between known sample voltage and secondary electron detector output signal being determined using secondary electron detector output signals detected at all time points within the AC period to obtain relative voltages to absolute values at the secondary electron signals corresponding to the peak values, and absolute values of the AC periodic voltage being determined in accordance with a correlation of the relative voltages to the absolute values at the secondary electron signals corresponding to the peak values.

7. A voltage measurement method using an electron beam according to claim 6 wherein when the peaks of the histograms are localized at a plurality of locations, peaks obtained with the lowest peak level are used as the peak voltage.

* * * * *